(12) United States Patent
Akiyama

(10) Patent No.: US 7,808,698 B2
(45) Date of Patent: Oct. 5, 2010

(54) SEMICONDUCTOR DEVICE

(75) Inventor: Tomoyuki Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/257,145

(22) Filed: Oct. 25, 2005

(65) Prior Publication Data

US 2006/0221438 A1  Oct. 5, 2006

(30) Foreign Application Priority Data

Mar. 31, 2005 (JP) ............... 2005-102946

(51) Int. Cl.
*H04B 10/17* (2006.01)
(52) U.S. Cl. ..................................... 359/344
(58) Field of Classification Search ................. 359/344
See application file for complete search history.

(56) References Cited

U.S. PATENT DOCUMENTS

| | | | | |
|---|---|---|---|---|
| 5,103,455 A | | 4/1992 | Eichen et al. ............. 372/50 |
| 5,134,671 A | * | 7/1992 | Koren et al. .............. 385/14 |
| 5,258,991 A | * | 11/1993 | Peterson ................ 372/50.21 |
| 5,282,080 A | * | 1/1994 | Scifres et al. ............. 359/344 |
| 5,414,554 A | * | 5/1995 | Aoyama ................. 359/344 |
| 5,523,879 A | * | 6/1996 | Ota ....................... 359/333 |
| 6,556,344 B2 | * | 4/2003 | Koren ................... 359/341.4 |
| 6,614,823 B2 | * | 9/2003 | Funabashi et al. ........ 372/50.11 |
| 6,853,479 B1 | * | 2/2005 | Ilchenko et al. ........... 359/337.5 |
| 2005/0008317 A1 | | 1/2005 | Kuramoto et al. ........... 385/129 |
| 2005/0041280 A1 | | 2/2005 | Lee et al. .................. 359/344 |
| 2006/0197960 A1 | * | 9/2006 | Bazylenko ............... 356/491 |

FOREIGN PATENT DOCUMENTS

| | | |
|---|---|---|
| JP | 4-229684 | 8/1992 |
| JP | 2001-111177 | 4/2001 |
| JP | 2005-10758 | 1/2005 |
| JP | 2005-72579 | 3/2005 |

OTHER PUBLICATIONS

Deri et al. Monolithic Integration of Optical Waveguide Circuitry with III-V Photodetectors for Advanced Lightwave Receivers. Journal of Lightwave Technology, vol. 11, No. 8, Aug. 1993.*
R.G. Broeke, et al.; "All-Optical Wavelength Converter With a Monolithically Integrated Digitally Tunable Laser"; *European Conference on Optical Communication ECOC*; 2002; 2 Sheets./Discussed in the specification.
Japanese Office Action mailed May 18, 2010, with English Translation.

* cited by examiner

*Primary Examiner*—Eric Bolda
(74) *Attorney, Agent, or Firm*—Kratz, Quintos & Hanson, LLP

(57) ABSTRACT

A semiconductor device including a semiconductor optical amplifier in which a photodetector is integrated without causing power loss at a low cost. The semiconductor device includes a semiconductor substrate, a semiconductor optical waveguide, at least partly capable of functioning as a semiconductor optical amplifier, to guide signal light, and a photodetector provided in a region other than a region where the semiconductor optical waveguide is provided, wherein the semiconductor optical waveguide and the photodetector are integrated on the semiconductor substrate.

16 Claims, 9 Drawing Sheets

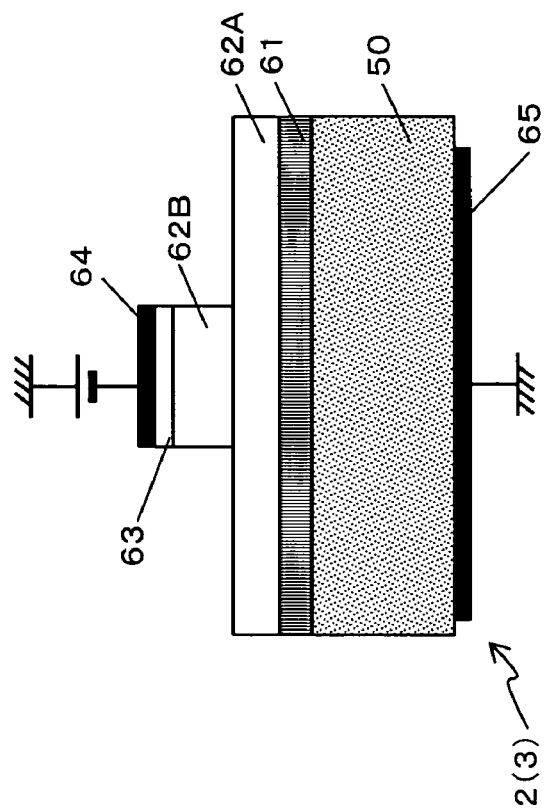
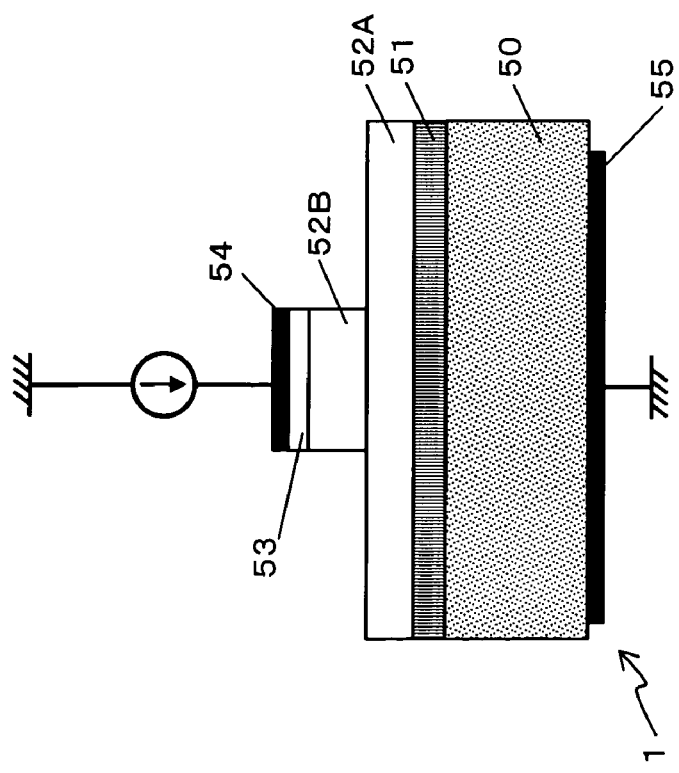
FIG. 8
FIG. 9

SEMICONDUCTOR DEVICE

CROSS REFERENCE TO RELATED APPLICATIONS

This application is based on and hereby claims priority to Japanese Application No. 2005-102946 filed on Mar. 31, 2005 in Japan, the contents of which are hereby incorporated by reference.

BACKGROUND OF THE INVENTION (1) Field of the Invention

The present invention relates to a semiconductor device suitable for use as a semiconductor optical amplifier employed in, for example, an optical communication system.

(2) Description of Related Art

Along with the recent remarkable increase in communication demand, a wavelength division multiplex (WDM) communication system allowing large capacity transmission with one optical fiber by multiplexing a plurality of signal lights of different wavelengths has been developed.

As an optical amplifier used in such an optical communication system, a semiconductor optical amplifier (SOA) which has a wide wavelength band and a small size and is capable of operating with low power consumption is considered to be desirable.

On the other hand, in recent years, the range of application of a large capacity and high speed photonic network has been enlarged also up to metropolitan access networks which is close to the subscribers. A photonic network applied to a metropolitan access network has a flexible network configuration using an optical add/drop multiplexer (OADM), etc.

In an optical amplifier used in such a network, there is a need to allow automatic gain control (AGC) or automatic power control (APC) to cope with any change in the number of wavelengths to be multiplexed or a change in the intensity of light to be inputted.

In order to realize such automatic gain control or automatic power control, there is demanded the gain control of the amplifier so as to obtain a desired gain or a desired output power while monitoring the input/output power. In this case, a power monitor (photodetector or power meter) for monitoring the input/output power is demanded.

However, provision of a power monitor as an individual part connected through an optical fiber would lead to increases in cost.

For this reason, there have been proposals to integrate a photodetector with a semiconductor optical amplifier for the reduction of cost (see, for example, R. G. Broeke et al. "ALL-OPTICAL WAVELENGTH CONVERTER WITH AMONOLITHICALLY INTEGRATED DIGITALLY TUNABLE LASER" European Conference on optical Communication (ECOC) 2002).

SUMMARY OF THE INVENTION

When a photodetector is integrated with a semiconductor optical amplifier, it is conceivable, as shown in FIG. 12, for example, that photodiodes 101 and 102 are provided on the input and output sides of a semiconductor optical amplifier 100 respectively. In other words, it is conceivable that a reverse bias voltage is applied to regions of the input and output sides of an optical waveguide capable of functioning as the semiconductor optical amplifier 100, thereby allowing the regions of the input and output sides of the semiconductor optical amplifier 100 to function as the photodetectors 101 and 102 respectively.

However, in this configuration, although the cost can be reduced, insertion loss of the photodetectors results in power loss of the input and output light, which is undesirable.

An increase in power loss of the input light causes an increase in the noise figure, thereby deteriorating the noise characteristic. On the other hand, an increase in power loss of the output light results in a decrease in output power. Furthermore, too large an amount of power of the input light or output light inputted to the photodetector results in deterioration of waveform quality, such as waveform distortion due to the saturation of the photodetector. In addition, there is a fear of bringing about a detection error (measurement error).

Furthermore, it is conceivable that a coupler, for example, is provided on each of the input and output sides of the optical waveguide capable of functioning as a semiconductor optical amplifier, and part of the input light and output light are branched and guided to the photodetectors by these couplers, to detect the power of the input light and output light, respectively.

However, in this configuration, when the input light and output light are branched by the couplers, power loss arises in the input light and output light.

As discussed above, an increase in power loss of the input light results in an increase in noise figure, thereby deteriorating the noise characteristic, while an increase in power loss of the output light results in a decrease in output power.

The present invention has been devised in view of such a problem, and aims to provide a semiconductor device allowing a photodetector to be integrated without causing any power loss at a low cost.

For this purpose, a semiconductor device according to the present invention comprises a semiconductor substrate, a semiconductor optical waveguide, at least partly capable of functioning as a semiconductor optical amplifier, to guide signal light, and a photodetector provided in a region other than a region where the semiconductor optical waveguide is provided, wherein the semiconductor optical waveguide and the photodetector are integrated on the semiconductor substrate.

A semiconductor device according to the present invention has therefore an advantage of allowing a photodetector to be integrated without causing any power loss at a low cost.

For this reason, when a photodetector is integrated with, for example, a semiconductor optical amplifier, the characteristic noise deterioration caused by provision of a photodetector on the input side of a semiconductor optical amplifier can be prevented, and the decrease in output power caused by provision of a photodetector on the output side of the semiconductor optical amplifier can be prevented.

In particular, because a photodetector is provided in a region other than a region where a semiconductor optical waveguide at least partly capable of functioning as a semiconductor optical amplifier is provided, even in the event of excessively large power of input light or output light, the deterioration of the waveform quality, such as waveform distortion by the saturation of the photodetector, can be prevented. Furthermore, even in the event of excessively large input light or output light, a detection error (measurement error) can be prevented from occurring.

BRIEF DESCRIPTION OF THE DRAWINGS

FIG. 8 is a schematic cross-sectional view showing another configuration of a semiconductor optical amplifier provided in a semiconductor device according to an embodiment of the present invention.

FIG. 9 is a schematic cross-sectional view showing another configuration of a photodetector provided in a semiconductor device according to an embodiment of the present invention.

DESCRIPTION OF THE PREFERRED EMBODIMENTS

Semiconductor devices according to the embodiments of the present invention will be described below with reference to the drawings.

First Embodiment

First, a semiconductor device according to the first embodiment will be described with reference to FIGS. 1 to 3.

Figure 1:
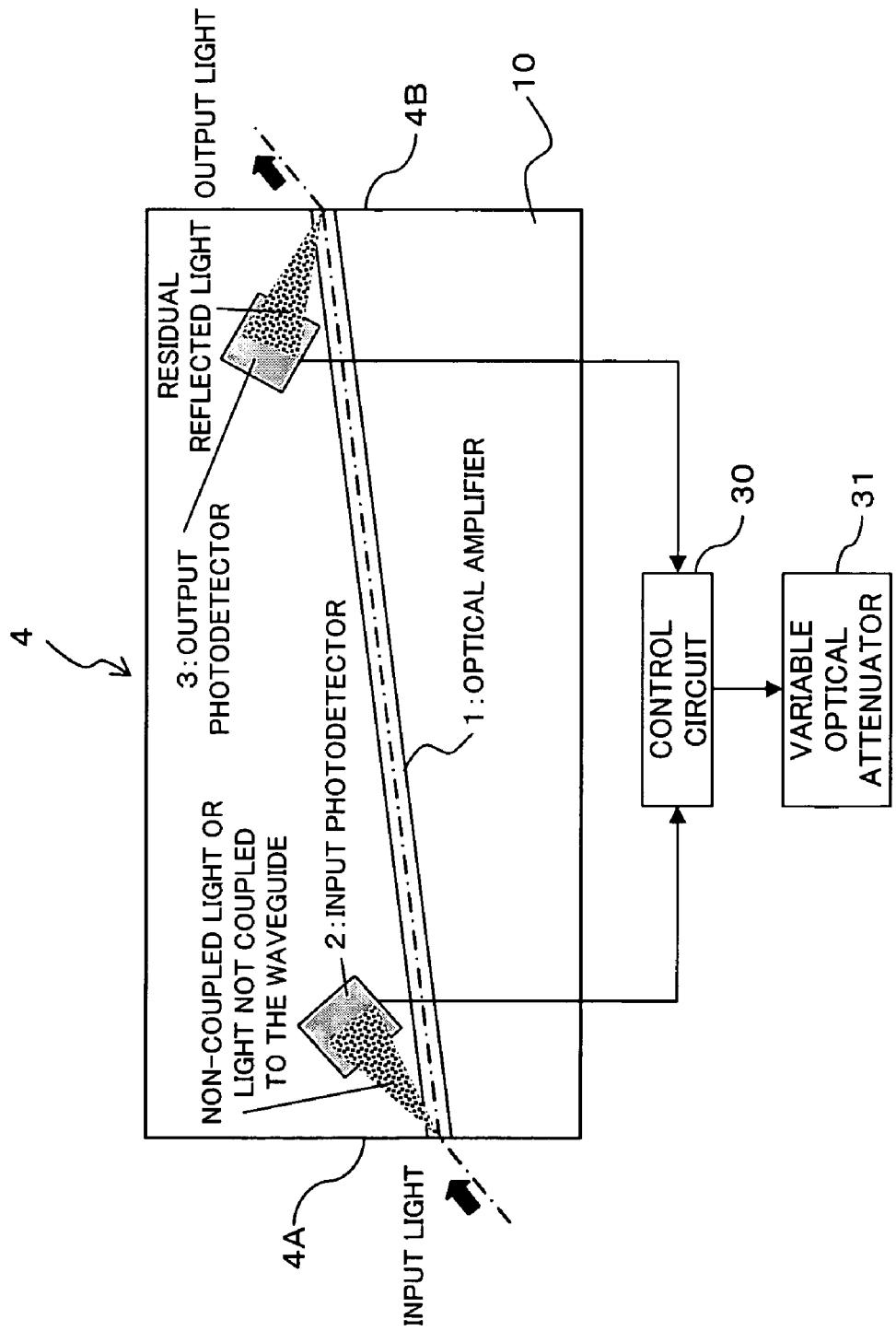
FIG. 1 is a schematic plan view showing the configuration of a semiconductor device according to the first embodiment of the present invention.

The semiconductor device according to this embodiment is configured, as shown in FIG. 1, as a semiconductor optical amplifying device (in-line power monitor integrated semiconductor optical amplifier) 4 in which a semiconductor optical amplifier (SOA) 1 and photodetectors 2 and 3 are monolithically integrated.

Specifically, as shown in FIG. 1, the structure of the semiconductor optical amplifying device 4 is such that there are integrated on a semiconductor substrate 10 a semiconductor optical amplifier (SOA) 1 for amplifying input light and outputting it as output light, an input photodetector 2 for detecting light not-coupled to the waveguide to monitor the power of the input light, and an output photodetector 3 for detecting residual reflected light to monitor the power of the output light.

Figure 2:
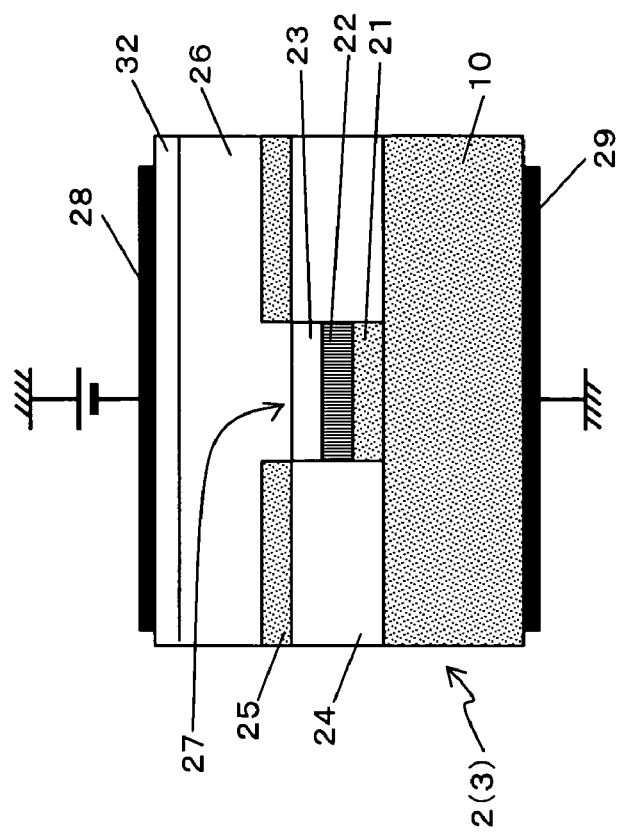
FIG. 2 is a schematic cross-sectional view showing the configuration of a semiconductor optical amplifier provided in a semiconductor device according to the first embodiment of the present invention.

In this embodiment, the semiconductor optical amplifier 1 has a semiconductor optical waveguide structure as shown in FIG. 2, with a buried heterostructure (BH structure) using an npnp thyristor structure as a current blocking structure being adopted.

In other words, the semiconductor optical amplifier 1 is configured, as shown in FIG. 2, as a semiconductor optical waveguide in which there are stacked on an n-type semiconductor substrate (lower cladding layer) 10 an n-type semiconductor lower light guiding layer 11, an undoped semiconductor active layer (waveguide core layer) 12 for producing a gain by current injection, a p-type semiconductor upper light guiding layer 13, a p-type semiconductor buried layer 14, an n-type semiconductor buried layer 15, a p-type semiconductor upper cladding layer 16, and a p-type semiconductor contact layer 20. The semiconductor optical amplifier 1 is also configured such that a mesa structure 17 formed by the n-type semiconductor lower light guiding layer 11, the undoped semiconductor active layer 12, and the p-type semiconductor upper light guiding layer 13 is buried in the p-type semiconductor buried layer 14 and the n-type semiconductor buried layer 15. Moreover, an n-type semiconductor buffer layer (lower cladding layer) may be formed as well on the n-type semiconductor substrate 10.

In this embodiment, the semiconductor optical amplifier 1 is configured, as shown in FIG. 1, as a striped (stripped) optical waveguide extending from the input-side end face 4A to the output-side end face 4B of the device 4. Light inputted from the input-side end face 4A of the device 4 is guided by the striped optical waveguide functioning as the semiconductor optical amplifier 1 and is then outputted from the output-side end face 4B on the opposite side. Furthermore, the optical waveguide functioning as the semiconductor optical amplifier 1 is formed obliquely to the end faces 4A and 4B of the device 4 in order to reduce reflection. It may be configured so as to provide a window structure near the output-side end face of the device 4.

The device 4 is also provided with a reflection reducing structure. That is, both of the end faces 4A and 4B of the device 4 are covered with a anti-refelction coating. In addition, for current injection, a p-side electrode 18 is provided on the p-type semiconductor contact layer 20, and an n-side electrode 19 is provided on the back side of the n-type semiconductor substrate 10.

In the semiconductor optical amplifier 1 configured thusly, a forward bias voltage is applied between the electrodes 18 and 19. When a forward bias voltage is applied, a current is injected into the active layer 12, so that a gain is generated, and thereby light inputted into the active layer 12 is amplified and outputted.

In this embodiment, the whole of the striped optical waveguide extending from the input-side end face 4A to the output-side end face 4B of the device 4 and capable of guiding signal light is configured as the semiconductor optical amplifier 1, however, the configuration is not limited to this. For example, the device 4 may be configured such that the striped optical waveguide extending from the input-side end face 4A to the output-side end face 4B of the device 4 at least partly functions as a semiconductor optical amplifier. Furthermore, the optical waveguide at least partly capable of functioning as a semiconductor optical amplifier is not limited to a striped optical waveguide and may be, for example, a Mach-Zehnder type optical waveguide or the like.

Furthermore, in this embodiment, semiconductor photodetectors having a waveguide structure (waveguide type semiconductor photodetectors) are used as the input photodetector 2 and output photodetector 3. Specifically, PIN photodiodes, for example, may be used. The waveguide structure of the PIN photodiodes 2, 3 are identical to the waveguide structure of the semiconductor optical amplifier 1 described above, however, they may be configured in such a manner so as to be different in that a reverse bias is applied to it.

Figure 3:
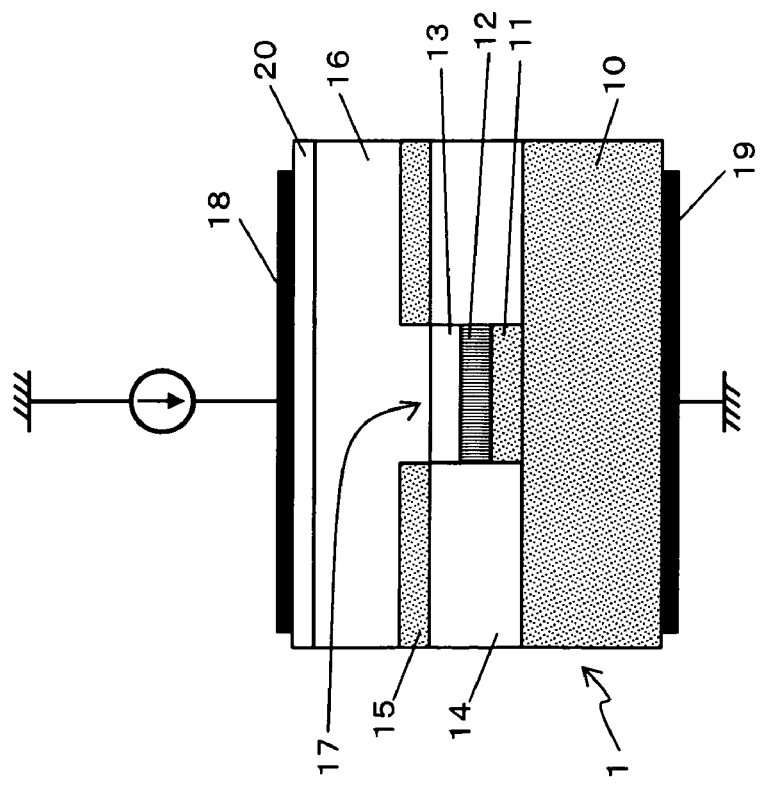
FIG. 3 is a schematic cross-sectional view showing the configuration of a photodetector provided in a semiconductor device according to the first embodiment of the present invention.

In other words, the PIN photodiodes 2, 3 are configured, as shown in FIG. 3, as a semiconductor optical waveguide in which an n-type semiconductor lower light guiding layer 21, an undoped semiconductor active layer (light absorbing layer or waveguide core layer) 22, a p-type semiconductor upper light guiding layer 23, a p-type semiconductor buried layer 24, an n-type semiconductor buried layer 25, a p-type semiconductor upper cladding layer 26, and a p-type semiconductor contact layer 32 are stacked on an n-type semiconductor substrate (lower cladding layer) 10. That is, the PIN photodiodes 2, 3 are configured such that a mesa structure 27 formed by the n-type semiconductor lower light guiding layer 21, the undoped semiconductor light absorbing layer 22, and the p-type semiconductor upper light guiding layer 23 is buried in the p-type semiconductor buried layer 24 and the n-type semiconductor buried layer 25. Moreover, an n-type semiconductor buffer layer (lower cladding layer) may be formed on the n-type semiconductor substrate 10 as well.

In addition, for current injection, a p-side electrode 28 is provided on the p-type semiconductor contact layer 32, and an n-side electrode 29 is provided on the back side of the n-type semiconductor substrate 10. A reverse bias voltage is applied between the electrodes 28 and 29.

The input photodetector 2 and the output photodetector 3 are not limited to this, and may be also, for example, avalanche photodiodes (APD) or the like.

In particular, in this embodiment, as shown in FIG. 1, the input photodetector 2 and the output photodetector 3 are each provided in a region other than a region where a semiconductor optical waveguide constituting the semiconductor optical amplifier 1 is provided.

In this embodiment, the input photodetector 2 is provided, as shown in FIG. 1, in a position on the input side of the device 4, where it is able to detect light radiated from the wall face of the semiconductor optical waveguide (light not-coupled to the waveguide) without being coupled to the semiconductor optical waveguide constituting the semiconductor optical amplifier 1. In other words, the input photodetector 2 is provided in a position through which passes light which has been radiated from the wall face of the semiconductor optical waveguide constituting the semiconductor optical amplifier 1 without being coupled to the semiconductor optical waveguide on the input side, and has been guided to the inside of the device 4 other than the semiconductor optical waveguide. In particular, the input photodetector 2 is preferably brought as close as possible to the input-side end face 4A of the device 4.

The output photodetector 3 is provided, as shown in FIG. 1, in a position where it is able to detect light (residual reflected light) reflected from the output side of the device 4 (output-side end face of the device, output-side end face of the semiconductor optical waveguide, window structure, or the like). In other words, the output photodetector 3 is provided in a position where light passes having been reflected, because of the semiconductor optical waveguide constituting the semiconductor optical amplifier 1 formed so as to have an oblique end face, from the output-side end face 4B of the device 4, and having been guided to the inside of the device 4 other than the semiconductor optical waveguide of the device 4. In particular, the output photodetector 3 is preferably brought as close as possible to the output-side end face 4B of the device 4.

As discussed above, in this embodiment, the input photodetector 2 and the output photodetector 3 are monolithically integrated in regions other than a region, on the semiconductor substrate 10, where the semiconductor optical waveguide constituting the semiconductor optical amplifier 1 is provided, and thereby insertion loss caused by provision of photodetectors on the optical waveguide extending to the input side or output side of the semiconductor optical amplifier 1 can be avoided, and the power of input light and the power of output light can be monitored at a low cost without causing power loss.

By the way, in this embodiment, as shown in FIG. 1, the input photodetector 2 and the output photodetector 3 are both connected with the control circuit 30 by which automatic gain control (AGC) and automatic power control (APC) are to be performed.

That is to say, the intensity of the input light detected by the input photodetector 2 and the intensity of the output light detected by the output photodetector 3 are inputted to the control circuit 30. The control circuit 30 is adapted to perform automatic power control on the basis of the intensity of the output light detected by the output photodetector 3. The control circuit 30 is also adapted to perform automatic gain control on the basis of the intensity of the output light detected by the output photodetector 3 and the intensity of the input light detected by the input photodetector 2. In this embodiment, the control circuit 30 includes a circuit for measuring the power of light on the basis of the intensities of light detected by the photodetectors 2 and 3. This optical power measuring circuit and the photodetectors 2 and 3 function as a power meter.

Input power is monitored by the input photodetector 2 and the control circuit 30, which thus function as an input power monitor. On the other hand, output power is monitored by the output photodetector 3 and the control circuit 30, which thus together function as an output power monitor.

For this purpose, a variable optical attenuator 31 is connected with the semiconductor optical amplifying device 4 through, for example, an optical fiber. The control circuit 30 performs automatic gain control and automatic power control by controlling the variable optical attenuator 31.

Configuration for performing automatic gain control and automatic power control is not limited to this. For example, a variable optical attenuator (intensity modulator) may be monolithically integrated with the semiconductor optical amplifying device and may be controlled by the control circuit. Furthermore, the semiconductor optical waveguide extending from the input-side end face to the output-side end face of the device may be so designed that one portion of it functions as an optical amplifier and the other portion functions as an optical attenuator, which is controlled by the control circuit. In other words, the semiconductor optical waveguide may be configured such that the p-side electrode or the n-side electrode consists of a plurality of electrodes (discrete electrode) in association with which a switch for changing the direction of a bias voltage to be applied is provided, wherein when the switch is turned to one side, a forward bias voltage is applied through the electrodes so that the optical waveguide functions as an amplifying region (optical amplifier), while when the switch is turned to the other side, a reverse bias voltage is applied through the electrodes so that the optical waveguide functions as an attenuation region (optical attenuator). In this case, in the semiconductor device, an optical amplifier, an optical attenuator (variable optical attenuator; intensity modulator), and photodetectors are monolithically integrated.

Thus, a semiconductor device according to this embodiment has an advantage of allowing photodetectors to be integrated without causing power loss at a low cost.

For this reason, for example, when the photodetectors 2 and 3 are integrated with, for example, the semiconductor optical amplifier 1, the noise characteristic deterioration caused by provision of a photodetector on the input side of the semiconductor optical amplifier 1 can be prevented, and the decrease in output power caused by provision of a photodetector on the output side of the semiconductor optical amplifier 1 can be prevented.

In particular, because the photodetectors 2 and 3 are provided in regions other than a region where a semiconductor optical waveguide at least partly capable of functioning as the semiconductor optical amplifier 1 is provided, even in the event of excessively large power of the input light or output light, the deterioration of waveform quality such as waveform distortion resulting from the saturation of the photodetector can be prevented. Furthermore, even in the event of excessively large input light or output light, a detection error (measurement error) can be prevented from occurring.

Second Embodiment

Figure 4:
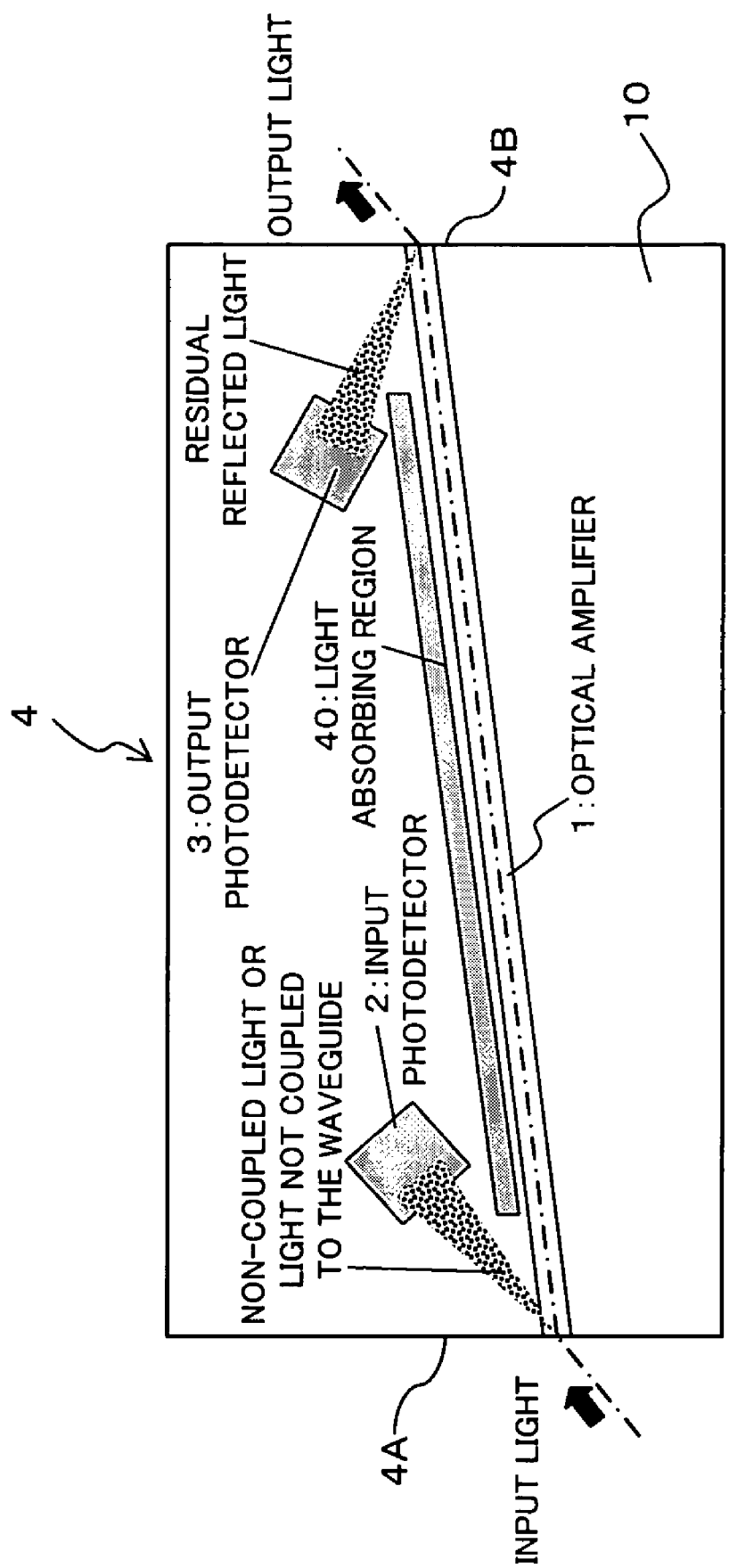
FIG. 4 is a schematic plan view showing the configuration of a semiconductor device according to the second embodiment of the present invention.

Next, a semiconductor device according to the second embodiment of the present invention will be described with reference to FIG. 4.

The semiconductor device according to this embodiment differs from the first embodiment described above in that it is provided with a light absorbing region.

In other words, in this semiconductor device, in addition to the first embodiment described above, as shown in FIG. 4, a light absorbing region 40 capable of absorbing non-guided radiated light (leakage light) from the wall face of the semiconductor optical waveguide without being guided by the semiconductor optical waveguide constituting the semiconductor optical amplifier 1 is provided between the semiconductor optical waveguide constituting the semiconductor optical amplifier 1 and the photodetectors 2 and 3. For this reason, the detection error (measurement error) caused by radiated light (leakage light) from the wall face of the semiconductor optical waveguide constituting the semiconductor optical amplifier can be avoided. In FIG. 4, identical notations are attached to the elements similar to those in FIG. 1.

In this embodiment, the light absorbing region 40 is formed in the form of a stripe extending from the input side to the output side in parallel with the semiconductor optical waveguide constituting the semiconductor optical amplifier 1 except regions through which light not-coupled to the waveguide or residual reflected light passes.

The light absorbing region 40 has the same waveguide structure as the semiconductor optical waveguide constituting the semiconductor optical amplifier 1. A forward bias voltage is applied to the semiconductor optical waveguide constituting the semiconductor optical amplifier 1, while a reverse bias voltage is applied to the light absorbing region 40 or no bias voltage is applied thereto. As a matter of course, in case that no bias voltage is applied to the light absorbing region 40, no electrode may be provided.

Because the detailed configuration is identical to that of the first embodiment described above, its explanation will be omitted here. Thus, the semiconductor device according to this embodiment has an effect similar to one of the first embodiment described above. Furthermore, it is also has an advantage of preventing the radiated light from the wall face of the semiconductor optical waveguide constituting the semiconductor optical amplifier 1 from being guided to the photodetectors 2, 3 because the light absorbing region 40 is provided.

Third Embodiment

Next, a semiconductor device according to the third embodiment of the present invention will be described with reference to FIG. 5.

The semiconductor device according to this embodiment differs from the first embodiment described above in that it is provided with optical waveguides for guiding light to the photodetectors.

In other words, in this semiconductor device, in addition to the first embodiment described above, as shown in FIG. 5, an optical waveguide for detecting input light (optical waveguide for monitoring) 41 is formed between an input side portion of the semiconductor optical waveguide constituting the semiconductor optical amplifier 1 and the input photodetector 2 such that non-guided radiated light from the wall face of the semiconductor optical waveguide constituting the semiconductor optical amplifier 1 is guided to the input photodetector 2 on the input side. In FIG. 5, identical notations are attached to the elements similar to those in FIG. 1.

Figure 5:
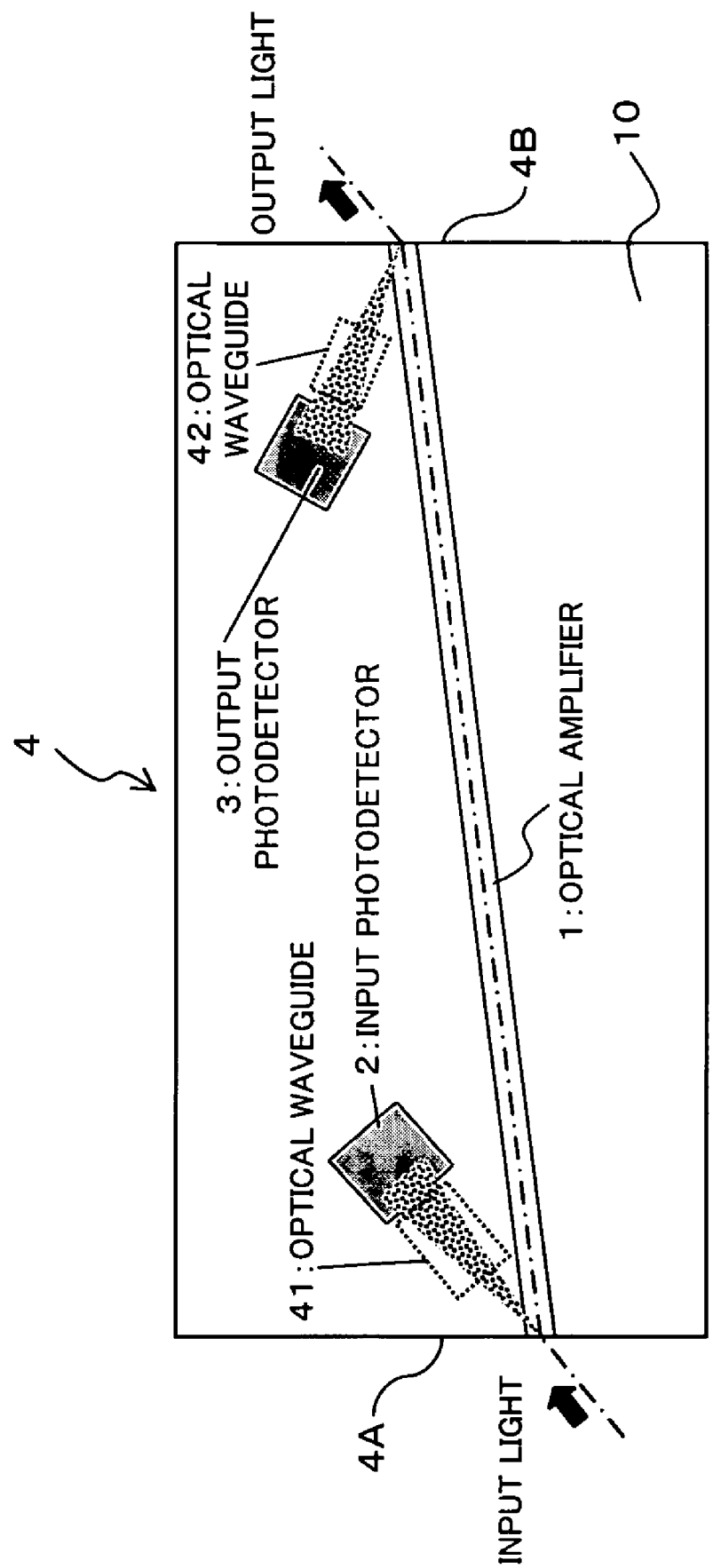
FIG. 5 is a schematic plan view showing the configuration of a semiconductor device according to the third embodiment of the present invention.

In addition, in this embodiment, as shown in FIG. 5, an optical waveguide for detecting output light (optical waveguide for monitoring) 42 is formed between an output side portion of the semiconductor optical waveguide constituting the semiconductor optical amplifier 1 and the output photodetector 3 such that light reflected from the output side (the output-side end face, the output-side end face of the semiconductor optical waveguide, the window structure, or the like) is guided to the output photodetector 3.

The optical waveguide for detecting input light 41 and the optical waveguide for detecting output light 42 have the same waveguide structure as the semiconductor optical waveguide constituting the semiconductor optical amplifier 1. These optical waveguides 41 and 42 are provided with no electrode because no bias voltage is applied to them.

Because the details of the configuration are identical to those of the first embodiment described above, their explanation is omitted here. Thus, the semiconductor device according to this embodiment has an effect similar to that of the first embodiment described above. Furthermore, it has an advantage that because the optical waveguide for detecting input light 41 and the optical waveguide for detecting output light 42 are provided, light can be effectively guided to the input photodetector 2 and the output photodetector 3, and thereby the sizes of the input photodetector 2 and output photodetector 3 can be reduced.

In this embodiment, the optical waveguide for detecting input light 41 and the optical waveguide for detecting output light 42 are configured so as to have the same waveguide structure as the semiconductor optical amplifier and be provided with no electrode, but this is not always required. For example, the optical waveguide for detecting input light 41 and the optical waveguide for detecting output light 42 may only function as an optical waveguide, and thereby may be formed with materials which cause no gain and no absorption.

Fourth Embodiment

Next, a semiconductor device according to the fourth embodiment of the present invention will be described with reference to FIG. 6.

The semiconductor device according to this embodiment differs from the first embodiment described above in that it is provided with amplifying regions for amplifying light guided to the photodetectors.

In other words, in this semiconductor device, in addition to the first embodiment described above, as shown in FIG. 6, an amplifying region for detecting input light 43 is formed between an input side portion of the semiconductor optical waveguide constituting the semiconductor optical amplifier 1 and the input photodetector 2 in such a manner as to enable the amplification of the non-guided radiated light which is radiated from the wall face of the semiconductor optical waveguide constituting the semiconductor optical amplifier 1 and is guided to the input photodetector 2 on the input side. In FIG. 6, identical notations are attached to the elements similar to those in FIG. 1.

Figure 6:
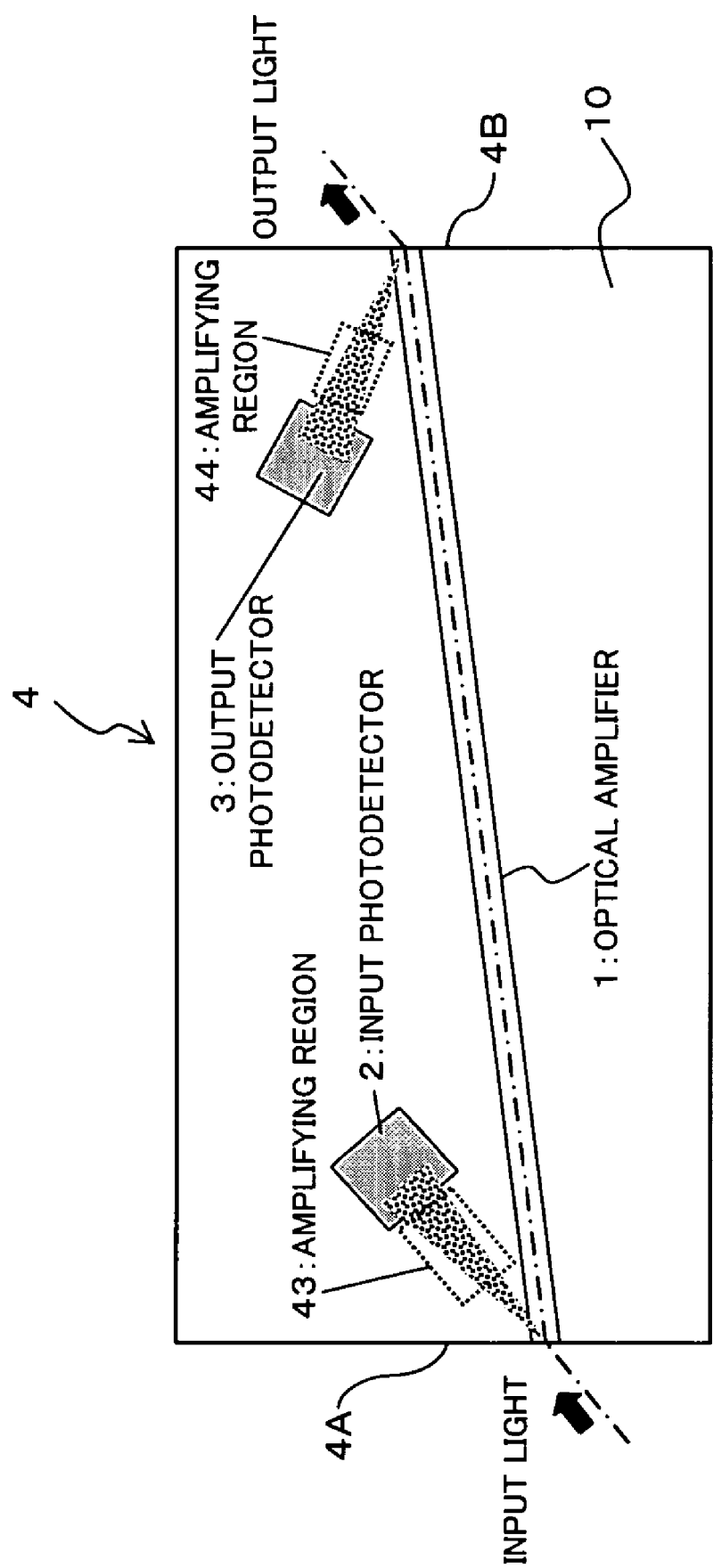
FIG. 6 is a schematic plan view showing the configuration of a semiconductor device according to the fourth embodiment of the present invention.

In addition, in this embodiment, as shown in FIG. 6, an amplifying region 44 for detecting output light is formed between an output side portion of the semiconductor optical waveguide constituting the semiconductor optical amplifier 1 and the output photodetector 3 in such a manner as to enable the amplification of the reflected light which is reflected from the output side (the output-side end face, the output-side end face of the semiconductor optical waveguide, the window structure, or the like) and is guided to the output photodetector 3.

The amplifying region for detecting input light 43 and the amplifying region for detecting output light 44 are both configured as an optical waveguide (optical waveguide for monitoring) and have the same waveguide structure as the semiconductor optical waveguide constituting the semiconductor optical amplifier 1. To the amplifying region for detecting input light 43 and the amplifying region for detecting output light 44, a forward bias voltage is applied, as with the semiconductor optical amplifier 1.

Because the detail of the configuration is identical to one of the first embodiment described above, its explanation is omitted here. Thus, the semiconductor device according to this embodiment has an effect similar to one of the first embodiment described above. Furthermore, it has an advantage that because the amplifying regions 43 and 44 are provided, and light guided to the photodetectors 2 and 3 is amplified, the sizes of the photodetectors 2 and 3 can be reduced.

Fifth Embodiment

Next, a semiconductor device according to the fifth embodiment of the present invention will be described with reference to FIG. 7.

The semiconductor device according to this embodiment differs from the first embodiment described above on positions where the photodetectors are provided.

Figure 7:
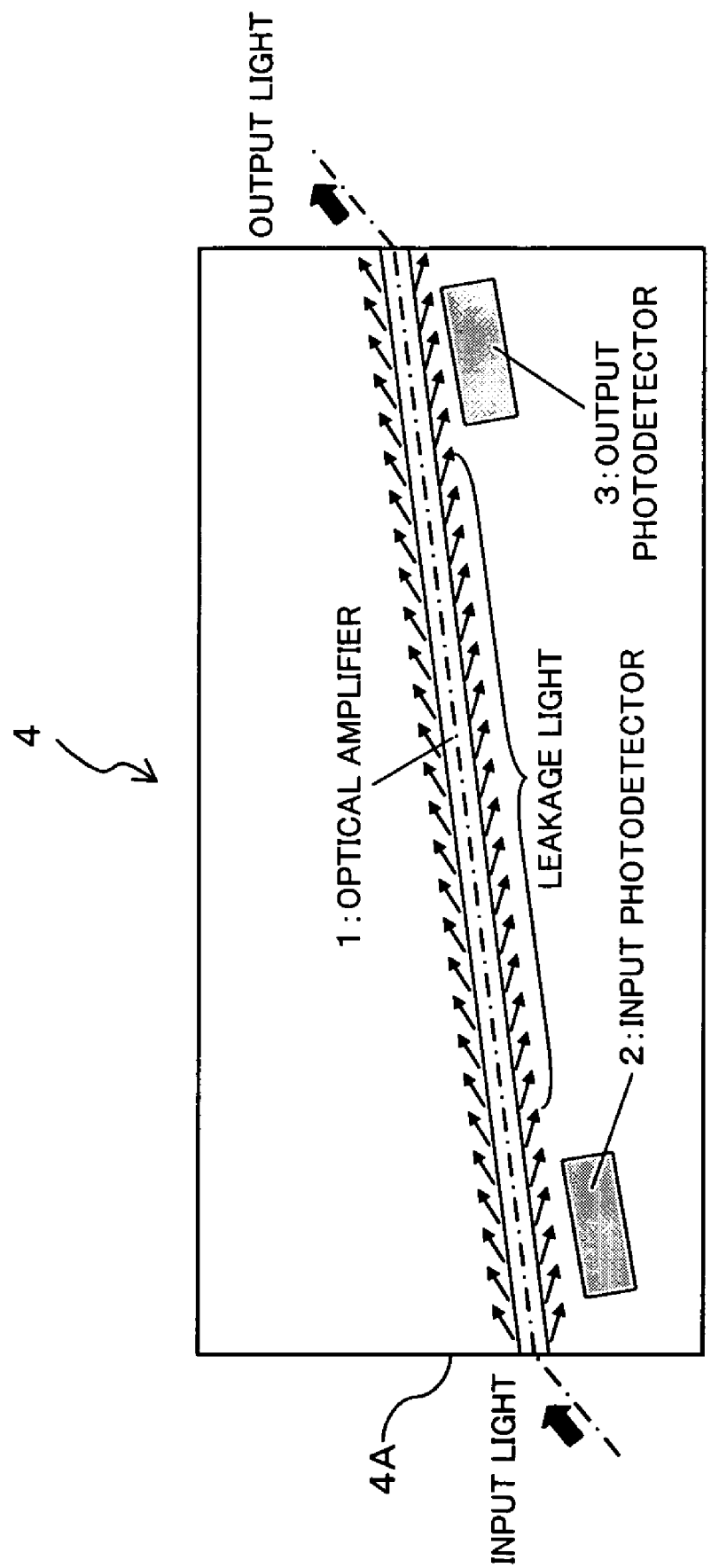
FIG. 7 is a schematic plan view showing the configuration of a semiconductor device according to the fifth embodiment of the present invention.

In other words, in this semiconductor device, as shown in FIG. 7, the input photodetector 2 and the output photodetector 3 are provided in positions where they can detect non-guided radiated light (leakage light) from the wall face of the semiconductor optical waveguide without being guided by the semiconductor optical waveguide constituting the semiconductor optical amplifier 1. In FIG. 7, identical notations are attached to the elements similar to those in FIG. 1.

In this semiconductor device, as shown in FIG. 7, the input photodetector 2 is formed along an input side portion of the semiconductor optical waveguide constituting the semiconductor optical amplifier 1 and in parallel with the semiconductor optical waveguide. In FIG. 7, identical notations are attached to the elements similar to those in FIG. 1.

In addition, in this semiconductor device, as shown in FIG. 7, the input photodetector 3 is formed along an output side portion of the semiconductor optical waveguide constituting the semiconductor optical amplifier 1 and in parallel with the semiconductor optical waveguide.

Because the details of this configuration are identical to one of the first embodiment described above, their explanation is omitted here.

Thus, the semiconductor device according to this embodiment has an effect similar to one of the first embodiment described above.

The configuration of this embodiment may be combined with the configuration of each of the embodiments described above.

[Others]

Each of the embodiments described above is provided with the input photodetector 2 and the output photodetector 3, but this is not always required and only one of them may be provided. For example, if it is enough to perform only automatic power control, only the output photodetector 3 may be provided. In this case, in the configuration of the third embodiment described above, only the optical waveguide for detecting output light 42 may be provided.

Furthermore, in each of the embodiments described above, the semiconductor optical amplifier 1 and the photodetectors 2 and 3 are integrated on the n-type semiconductor substrate 10 but may be integrated on a p-type semiconductor substrate.

In addition, each of the embodiments described above is but not limited to a buried semiconductor device.

For example, it may be configured as a ridge type semiconductor device.

In this case, as shown in FIG. 8, the semiconductor optical amplifier 1 may be configured as a semiconductor optical waveguide in which an undoped semiconductor active layer (waveguide core layer) 51 producing a gain by current injection, a p-type semiconductor upper first cladding layer 52A, a p-type semiconductor upper second cladding layer 52B, and a p-type semiconductor contact layer 53 are stacked on an n-type semiconductor substrate (lower cladding layer) 50. Moreover, an n-type semiconductor buffer layer (lower cladding layer) may be formed on the n-type semiconductor substrate 50. For current injection, it may be configured such that a p-side electrode 54 is provided on the p-type semiconductor contact layer 53, and an n-side electrode 55 is provided on the rear side of the n-type semiconductor substrate 50, to apply a forward bias voltage between the electrodes.

On the other hand, as shown in FIG. 9, each of the input photodiode 2 and output photodiode 3 may be configured as a semiconductor optical waveguide in which an undoped semiconductor optical absorbing layer (waveguide core layer) 61, a p-type semiconductor first upper cladding layer 62A, a p-type semiconductor second upper cladding layer 62B, and a p-type semiconductor contact layer 63 are stacked on an n-type semiconductor substrate (lower cladding layer) 50. Moreover, an n-type semiconductor buffer layer (lower cladding layer) may be formed on the n-type semiconductor substrate 50. For current injection, it may be configured such that a p-side electrode 64 is provided on the p-type semiconductor contact layer 63, and an n-side electrode 65 is provided on the back side of the n-type semiconductor substrate 50, to apply a reverse bias voltage between the electrodes.

Furthermore, it may be configured as, for example, a high mesa type semiconductor device.

Figure 10:
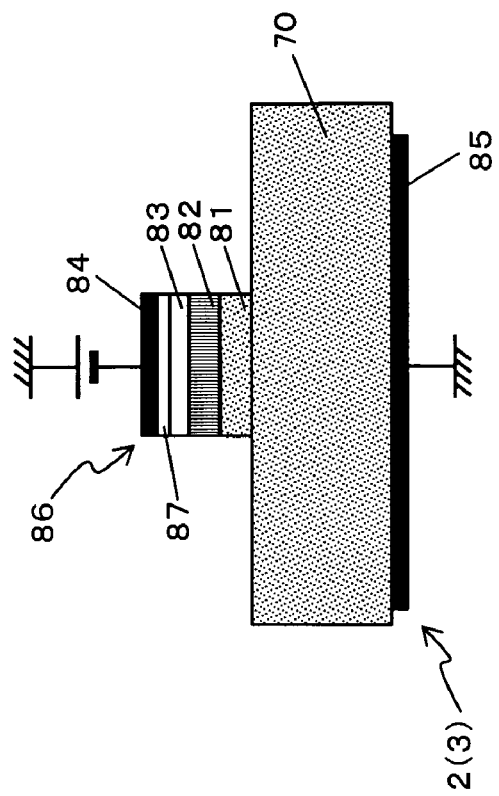
FIG. 10 is a schematic cross-sectional view showing another configuration of a semiconductor optical amplifier provided in a semiconductor device according to an embodiment of the present invention.

In this case, as shown in FIG. 10, the semiconductor optical amplifier 1 may be configured as a semiconductor optical waveguide in which a n-type semiconductor lower cladding layer 71, an undoped semiconductor active layer (waveguide core layer) 72 producing a gain by current injection, a p-type semiconductor upper cladding layer 73, and a p-type semiconductor contact layer 77 are stacked on an n-type semiconductor substrate 70. In other words, it may be configured as a semiconductor optical waveguide comprising a mesa structure 76, having a predetermined height or more, formed by an n-type semiconductor lower cladding layer 71, an undoped semiconductor active layer 72, a p-type semiconductor upper cladding layer 73, and a p-type semiconductor contact layer 77. Moreover, an n-type semiconductor buffer layer (lower cladding layer) may be formed on the n-type semiconductor substrate 70. For current injection, it may be configured such that a p-side electrode 74 is provided on the p-type semiconductor contact layer 77, and an n-side electrode 75 is provided on the rear side of the n-type semiconductor substrate 70, to apply a forward bias voltage between the electrodes.

Figure 11:
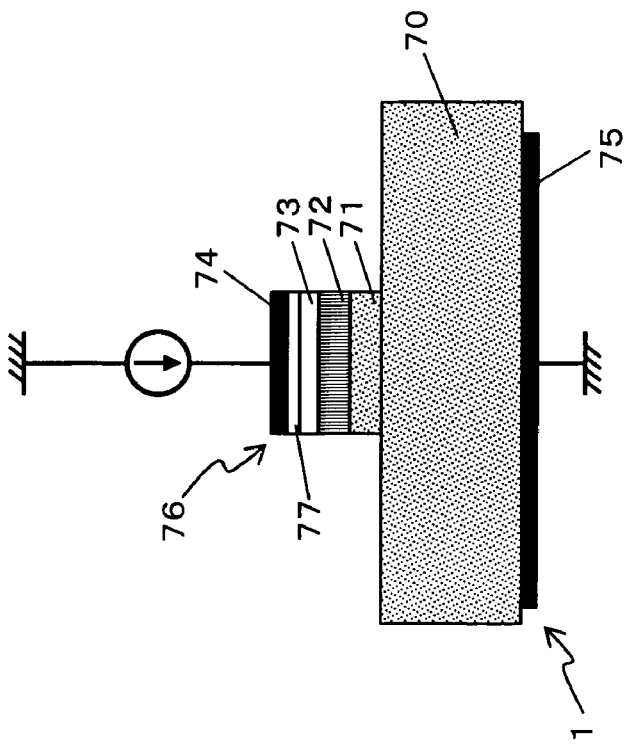
FIG. 11 is a schematic cross-sectional view showing another configuration of a photodetector provided in a semiconductor device according to an embodiment of the present invention.
Figure 12:
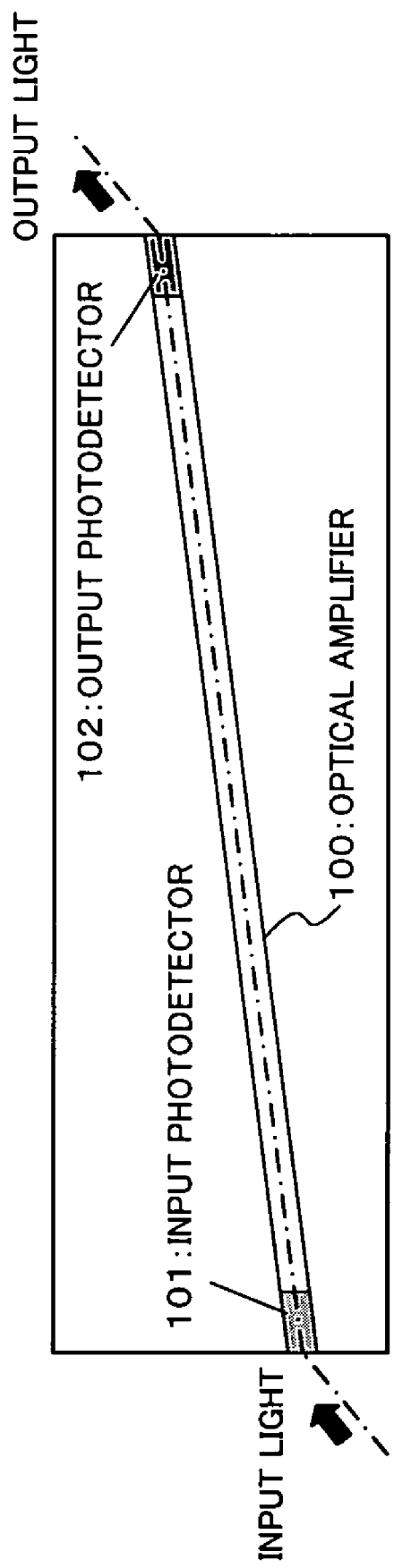
FIG. 12 is a schematic diagram showing an example of integrating photodiodes with a semiconductor optical amplifier.

On the other hand, as shown in FIG. 11, each of the input photodiode 2 and output photodiode 3 may be configured as a semiconductor optical waveguide in which an n-type semiconductor lower cladding layer 81, an undoped semiconductor optical absorbing layer (waveguide core layer) 82, a p-type semiconductor upper cladding layer 83, and a p-type semiconductor contact layer 87 are stacked on an n-type semiconductor substrate 70. In other words, it may be configured as a semiconductor optical waveguide comprising a mesa structure 86, having a predetermined height or more, formed by an n-type semiconductor lower cladding layer 81, an undoped semiconductor active layer 82, a p-type semiconductor upper cladding layer 83, and a p-type semiconductor contact layer 87. Moreover, an n-type semiconductor buffer layer (lower cladding layer) may be formed on the n-type semiconductor substrate 70. For current injection, it may be configured such that a p-side electrode 84 is provided on the p-type semiconductor contact layer 87, and an n-side electrode 85 is provided on the rear side of the n-type semiconductor substrate 70, to apply a reverse bias voltage between the electrodes.

The present invention is not limited to the embodiments described above, and may include various modifications without departing from the sprit and scope of the present invention. For example, in each of the embodiments and variations described above, a semiconductor optical waveguide and photodetectors are arranged and integrated in a horizontal direction (a direction parallel to the substrate) to each other on the semiconductor substrate, but may be arranged and integrated in a vertical direction (a direction perpendicular to the substrate; in the layering direction) to each other.

What is claimed is:

1. A semiconductor device comprising:
   a semiconductor substrate;
   a semiconductor optical waveguide to guide signal light from an input-side end face to an output-side end face of said semiconductor device;
   a photodetector to detect part of light laterally radiated from a side wall face which defines said semiconductor optical waveguide and passing through a region, which does not have a waveguide structure to confine light in lateral direction, of said semiconductor device, the radiated light being part of the signal light;
   an output photodetector provided at a position where light reflected on the output side can be detected, and
   said semiconductor optical waveguide and said photodetector integrated on said semiconductor substrate.

2. A semiconductor device according to claim 1, wherein said output photodetector is provided at a position where light reflected on the output-side end face of said device can be detected.

3. A semiconductor device according to claim 1, further comprising an optical waveguide for detecting output light, adapted to guide light reflected on the output side to said output photodetector.

4. A semiconductor device according to claim 1, comprising, as said photodetector,
   an input photodetector provided at a position where light radiated from the wall face of said semiconductor optical waveguide without being coupled to said semiconductor optical waveguide on the input side can be detected.

5. A semiconductor device according to claim 4, further comprising an optical waveguide for detecting input light, adapted to guide non-guided radiated light from the wall face of said semiconductor optical waveguide to said input photodetector on the input side.

6. A semiconductor device according to claim 1, comprising, as said photodetector,
   an input photodetector provided along an input side portion of said semiconductor optical waveguide in such a manner as to enable the detection of non-guided radiated light from the wall face of said semiconductor optical waveguide without being guided by said semiconductor optical waveguide.

7. A semiconductor device comprising,
   a semiconductor substrate;
   a semiconductor optical waveguide to guide signal light from an input-side end face to an output-side end face of said semiconductor device;
   a photodetector to detect part of light laterally radiated from a side wall face which defines said semiconductor optical waveguide and passing through a region, which does not have a waveguide structure to confine light in lateral direction, of said semiconductor device, the radiated light being part of the signal light;
   a semiconductor optical amplifier provided in at least part of a region where said semiconductor optical waveguide is provided, and
   said semiconductor optical waveguide and said photodetector integrated on said semiconductor substrate,
   wherein said photodetector has the same waveguide structure as said semiconductor optical waveguide, and said semiconductor device is configured such that a forward bias voltage is applied to the semiconductor optical amplifier portion of said semiconductor optical waveguide and a reverse bias voltage is applied to said photodetector.

8. A semiconductor device according to claim 1, further comprising a light absorbing region capable of absorbing non-guided radiated light from the wall face of said semiconductor optical waveguide without being guided by said semiconductor optical waveguide.

9. A semiconductor device according to claim 8, wherein said light absorbing region has the same waveguide structure as said semiconductor optical waveguide, and said semiconductor device is configured such that a forward bias voltage is applied to the semiconductor optical amplifier portion of said semiconductor optical waveguide and a reverse bias voltage is applied to said light absorbing region or no bias voltage is applied thereto.

10. A semiconductor device according to claim 1, further comprising an amplifying region for amplifying light guided to said photodetector.

11. A semiconductor device according to claim 10, wherein said amplifying region has the same waveguide structure as said semiconductor optical waveguide.

12. A semiconductor device according to claim 1, further comprising an semiconductor optical amplifier provided in at least part of a region where said semiconductor optical waveguide is provided.

13. A semiconductor device comprising:

a semiconductor substrate;

a semiconductor optical waveguide adapted to guide signal light from an input-side end face to an output-side end face of said semiconductor device;

a photodetector detecting light radiated from a side wall face of said semiconductor optical waveguide, the radiated light being part of the signal light; and an output photodetector provided at a position where light reflected on the output side can be detected, wherein an entire length of said semiconductor optical waveguide is formed obliquely to an end face of said device.

14. A semiconductor device according to claim 13, comprising as said photodetector, an input photodetector provided at a position where light radiated from the wall face of said semiconductor optical waveguide without being couple to said semiconductor optical waveguide on the input side can be detected.

15. A semiconductor device according to claim 13, further comprising a semiconductor optical amplifier provided in at least part of a region where said semiconductor optical waveguide is provided, Wherein said photodetector has the same waveguide structure as said semiconductor optical waveguide, and said semiconductor device is configured such that a forward bias voltage is applied to the semiconductor optical amplifier portion of said semiconductor optical waveguide and a reverse bias voltage is applied to said photodetector.

16. A semiconductor device according to claim 13, further comprising a semiconductor optical amplifier provided in at least part of a region where said semiconductor optical waveguide is provided.

* * * * *